US006103095A

United States Patent [19]

Chakravorty

[11] Patent Number: 6,103,095

[45] **Date of Patent: *Aug. 15, 2000**

[54] NON-HAZARDOUS WET ETCHING METHOD

[75] Inventor: Kishore K. Chakravorty, San Jose, Calif.

[73] Assignee: Candescent Technologies Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/032,433

[22] Filed: Feb. 27, 1998

[51] Int. Cl.[7] .............................. B23H 3/00; B23H 5/00; C25F 3/00; C25F 7/00; H05K 3/07

[52] U.S. Cl. ............................................ 205/684; 205/674

[58] Field of Search .................................... 205/640, 666, 205/674, 684

[56] References Cited

U.S. PATENT DOCUMENTS

| | | | |
|---|---|---|---|
| 3,975,245 | 8/1976 | Bergquist et al. | 204/129.95 |
| 4,432,846 | 2/1984 | Honeycutt, III | 204/129.95 |
| 4,904,312 | 2/1990 | Beckley et al. | 148/110 |
| 4,952,272 | 8/1990 | Okino et al. | 156/630 |
| 5,269,904 | 12/1993 | Fong et al. | 205/87 |
| 5,391,269 | 2/1995 | Fiering et al. | 204/129.75 |
| 5,439,565 | 8/1995 | Torii et al. | 204/129.1 |
| 5,639,343 | 6/1997 | Dobkin | 156/627.1 |
| 5,731,216 | 3/1998 | Holmberg et al. | 437/40 |
| 5,766,446 | 1/1998 | Spindt et al. | 205/640 |
| 5,863,233 | 1/1999 | Porter et al. | 445/50 |

OTHER PUBLICATIONS

Hubner et al. (The Pratical Anodising of Aluminum, Macdonald & Evans, London, pp. 20–25, no month available), 1960.

*Primary Examiner*—Kathryn Gorgos
*Assistant Examiner*—Wesley A. Nicolas
*Attorney, Agent, or Firm*—Wagner, Murabito & Hao LLP

[57] ABSTRACT

A method for selectively wet etching material during the formation of a field emission display device. In one embodiment, the selective wet etching method comprises immersing, in a fluid bath, a structure having a conductive row layer and a resistor layer. The structure further includes a pad area. In this embodiment, the fluid bath includes an organic-acid etchant. The present embodiment then applies a potential to the structure such that exposed regions of the resistor layer are selectively wet etched without significantly etching the conductive row layer or the pad area. In so doing, the present embodiment etches selected materials without requiring the use of highly toxic and hazardous conventional etchants.

12 Claims, 4 Drawing Sheets

NON-HAZARDOUS WET ETCHING METHOD

FIELD OF THE INVENTION

The present claimed invention relates to the field of flat panel displays. More particularly, the present claimed invention relates to the formation of a row electrode for a flat panel display screen structure.

BACKGROUND ART

Field emission display devices are typically comprised of numerous layers. The layers are formed or deposited using various fabrication process steps. Prior Art FIG. 1A is a schematic side sectional view of a portion of an exemplary conventional field emission display structure. More specifically, Prior Art FIG. 1A illustrates a substrate 100 having a conductive row electrode layer 102 formed thereon. A resistive layer 104 and an overlying inter-metal dielectric layer 106 are also disposed above substrate 100 and conductive row electrode layer 102.

During the fabrication of a field emission display device, it is often necessary to etch or remove portions of a layer (e.g. layer 104). For example, it is often necessary to remove or etch portions of resistor layer 104, in order to define the shape of a resistor layer.

Most conventional etching processes are conducted using extremely caustic and hazardous materials. Such materials increase field emission device fabrication costs, introduce potential severe environmental damage, and can damage various other layers and structures of the field emission display device. More specifically, the handling and disposal of such caustic materials must be handled in accordance with strict governmental regulations and, consequently, such regulatory handling introduces increased costs. The threat of potential environmental damage also contributes to the increased disposal and handling costs associated with conventional hazardous etchants.

With reference now to Prior Art FIG. 1B, using such hazardous and caustic materials to etch portions of a particular layer often results in damage to other portions or layers of the field emission display device. As a result, layers or portions of the field emission display device which are not to be etched or removed may be compromised by the hazardous and caustic etchant. As shown in Prior Art FIG. 1B, during the etching of resistor layer 104, using a caustic and hazardous etchant, portions of row electrode layer 102 are adversely affected in region 108.

Thus, a need exists for an etching process which can remove selected portions or materials during the fabrication of a field emission display device wherein the etchant is not extremely hazardous. A further need exists for an etching process which can remove selected portions or materials during the fabrication of a field emission display device wherein the etchant does not pose a threat of potential severe environmental damage. Still another need exists for an etching process which can remove selected portions or materials during the fabrication of a field emission display device without significantly compromising various other portions or layers of the field emission display device.

SUMMARY OF INVENTION

The present invention provides an etching process which can remove selected portions or materials during the fabrication of a field emission display device wherein the etchant is not extremely hazardous. The present invention further provides an etching process which can remove selected portions or materials during the fabrication of a field emission display device wherein the etchant does not pose a threat of potential severe environmental damage. Additionally, the present invention provides an etching process which can remove selected portions or materials during the fabrication of a field emission display device without significantly compromising various other portions or layers of the field emission display device.

Specifically, in one embodiment, the selective wet etching method comprises immersing, in a fluid bath, a structure having a conductive row layer, a resistor layer, and an inter-metal dielectric layer. The structure further includes a pad area having the inter-metal dielectric layer disposed thereover. In this embodiment, the fluid bath includes an organic-acid etchant. The present embodiment then applies a potential to the structure such that exposed regions of the resistor layer are selectively wet etched without significantly etching the conductive row layer or the pad area. In so doing, the present embodiment etches selected materials without requiring the use of highly toxic and hazardous conventional etchants.

In another embodiment, the present invention includes the features of the above embodiment, and further protectively anodizes the pad area by continuing to subject the pad area to a potential and the organic-acid etchant after the inter-metal dielectric layer has been selectively wet etched from said pad area.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

Prior Art

Prior Art

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present non-hazardous etching process is well suited for use on various layers of a field emission display device at various development stages during the fabrication of the field emission display device. The following discussion will begin with a description of a few exemplary field emission display fabrication steps leading to the formation of a field emission display device at a particular stage of development. The following discussion and will then be followed by a description of how the present non-hazardous etching process is used on the field emission display device in that exemplary stage of development. Although a description of the present non-hazardous etching process is recited in conjunction with particular layers and with a field emission display device at a particular stage of development, such a specific example is set forth for purposes of clarity. It will be understood that the present non-hazardous etching process is well suited for use on various layers of a field emission display device at various development stages during the fabrication of the field emission display device.

Figure 1A:
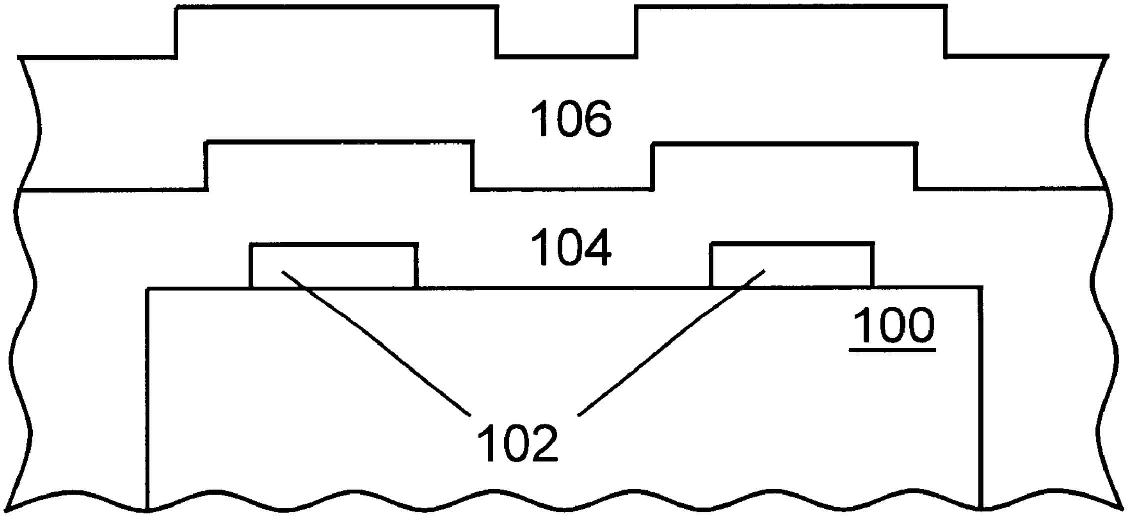
FIGURE 1A (PRIOR ART)
FIG. 1A is a side sectional view illustrating an exemplary conventional field emission display structure.
Figure 1B:
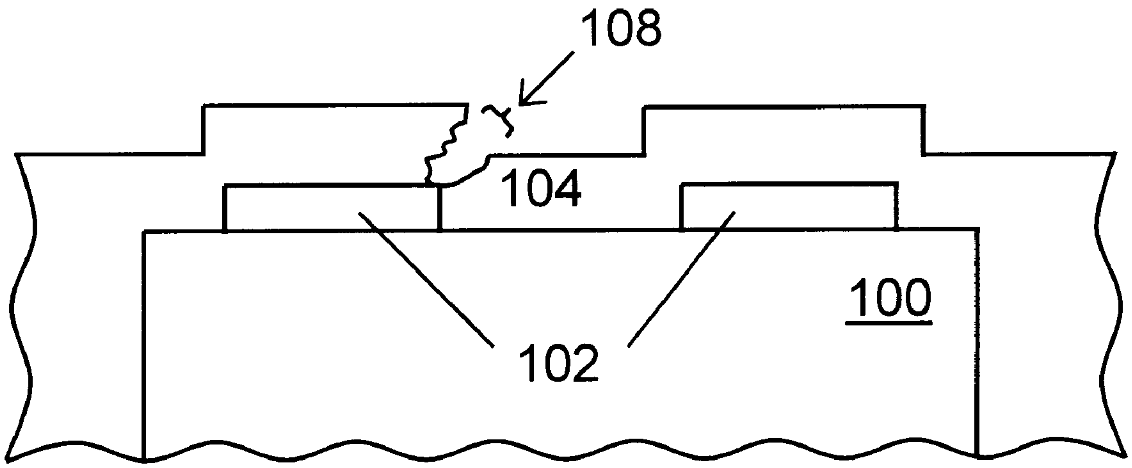
FIGURE 1B (PRIOR ART)
FIG. 1B is a side sectional view of the structure of Prior Art FIG. 1A having deleteriously affected layers.
Figure 2:
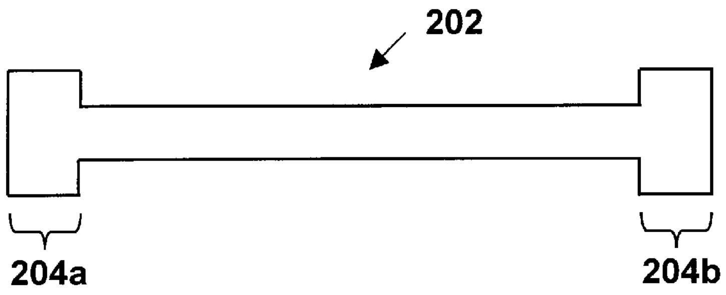
FIG. 2 is a top plan view of a row electrode.

With reference now to FIG. 2, a top plan view of row electrode of field emission display device used in conjunction with the non-hazardous etching process of the present invention is shown. In the present embodiment, a substrate, not shown, has a row electrode, typically shown as 202, formed thereon. In the embodiment of FIG. 2, row electrode 202 is formed by depositing a conductive layer of material and patterning the conductive layer of material to form row electrode 202. In the present embodiment, row electrode 202 is formed of aluminum. The present invention is also well suited however, to use with a row electrode which is comprised of more than one type of conductive material. For example, in another embodiment of the present invention, row electrode 202 is comprised of aluminum having a top surface clad with tantalum. In yet another embodiment of the present invention, row electrode 202 is comprised of aluminum having a top surface and side surfaces clad with tantalum. Although such a row electrode formation method is described in conjunction with the present embodiment, the present invention is well suited to use with row electrodes formed using various other row electrode formation techniques or methods. In the following discussion, only two row electrodes 202 are shown and described for purposes of clarity. It will be understood, however, that the present invention is well suited to implementation with an array of such row electrodes.

With reference still to FIG. 2, in the present embodiment, row electrode 202 includes pad areas 204*a* and 204*b*. The pad areas are used to couple row electrode 202 to a current source.

Figure 3A:
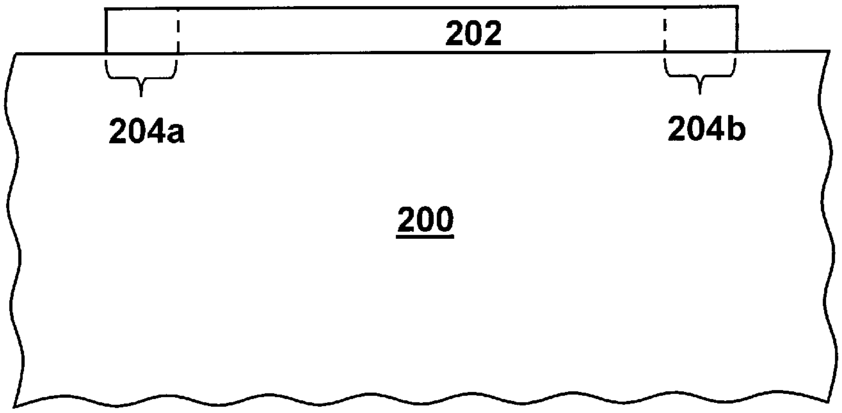
FIG. 3A is a side sectional view of a field emission display device during a fabrication step in which a row electrode is formed above a substrate.

Referring next to FIG. 3A, a side sectional view of a row electrode is shown. In the present embodiment, substrate 200 has row electrode 202 formed thereon. Row electrode 202 of FIG. 3 also includes pad regions 204*a* and 204*b*. As mentioned above, in the present embodiment, row electrode 202 is formed of a conductive material such as, for example, aluminum. Although such a row electrode structure is recited in the present embodiment, the present invention is also well suited to an embodiment in which the row electrode structure is comprised of a combination of materials. Such a combination of materials includes, for example, an aluminum row electrode which is partially clad with tantalum, an aluminum electrode which is entirely covered with tantalum, and the like.

Figure 3B:
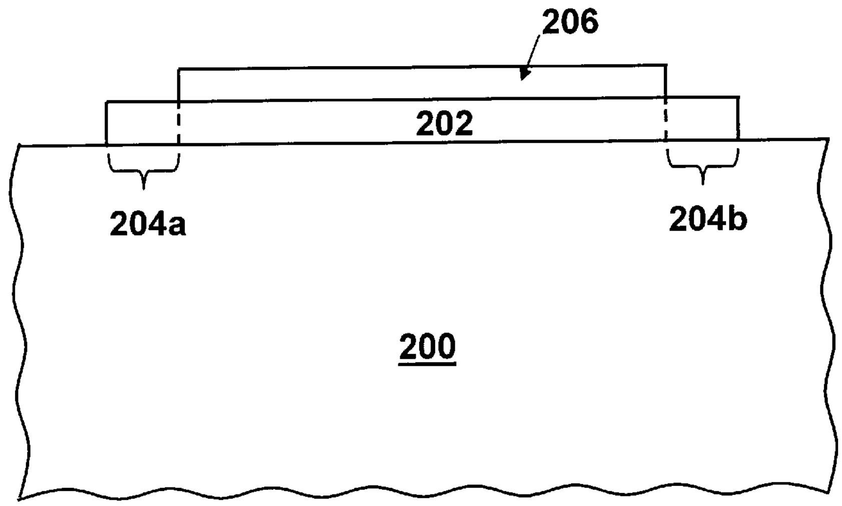
FIG. 3B is a side sectional view of the field emission display device of FIG. 3A having a resist layer formed thereover.
Figure 3C:
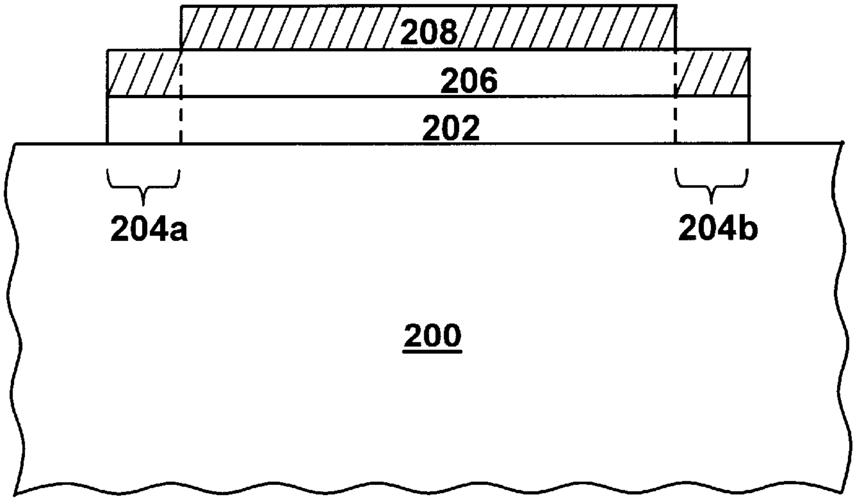
FIG. 3C is a side sectional view of the field emission display device of FIG. 3B having another layer formed thereover.

Referring next to FIG. 3B, during fabrication steps a resistor layer 206 is deposited over portions of row electrode 202. The non-hazardous etching process of the present invention is well suited for use with a field emission display device which is fabricated having such a resistor layer 206 deposited over row electrode 202. In one embodiment, resistor layer 206 is formed of silicon carbide (SiC), Cermet, or a dual layer combination. Although not shown in FIG. 3B (in order to clearly show pad areas 204*a* and 204*b*) it will be understood that resistor layer 206 is also commonly deposited over pad areas 204*a* and 204*b*.

Figure 4:
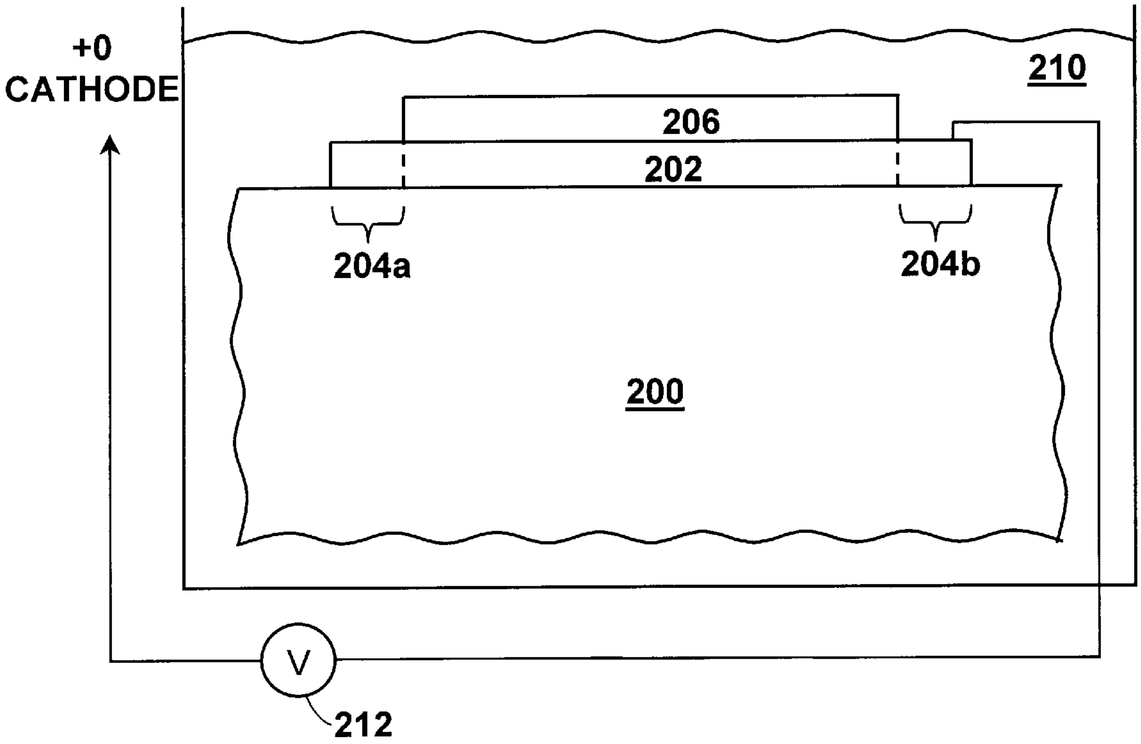
FIG. 4 is a side sectional view of the field emission display device of FIG. 3B immersed in an etchant bath in accordance with the present claimed invention.

With reference now to FIG. 4, a side sectional view of the field emission display device of FIG. 3B immersed in an etchant bath 210 in accordance with the present claimed invention is shown. In the present embodiment, material (e.g. inter-resistor layer 206) is selectively wet etched without deleteriously affecting other layers (e.g. row electrode 202).

Referring still to FIG. 4, in the present embodiment, etchant bath 210 is comprised of deionized water including an organic-acid etchant. In one embodiment, the organic-acid etchant is an oxo-acid such as, for example, citric acid, acetic acid, and the like.

Referring again to FIG. 4, in the present embodiment, etchant bath 210 is comprised of a one (1) percent solution of citric acid in deionized water. Thus, unlike prior art etchants, which are often extremely caustic and hazardous, etchant bath 210 used in the present embodiment is relatively safe and, therefore, non-hazardous. As a result, unlike caustic and hazardous prior art etchants, the etchant bath of the present embodiment does not increase field emission device fabrication costs by introducing potential severe environmental damage. More specifically, etchant bath 210 of the present embodiment can be handled and disposed of without being subjected to egregiously strict governmental regulations. Therefore, handling and disposal of etchant bath 210 can be accomplished at a lower cost than is associated with the handling and disposal of the caustic and hazardous etchants associated with conventional etching processes.

In the embodiment of FIG. 4, a voltage source 212 applies an anodic potential to row electrode 202. A corresponding cathodic potential is applied to the cathode, as indicated in FIG. 4. Resistor layer 206 is in electrical contact with row electrode 202 and, therefore, resistor layer also gets biased to an anodic potential although the magnitude of the anodic potential may be different than the potential applied to row electrode 202. In the present invention, etching of resistor layer 206 will occur with an anodic potential greater than approximately 2 volts. In one embodiment, an anodic potential of 2–30 volts is applied to row electrode 202. Although such an anodic potential is recited in the present embodiment, the present invention is also well suited to using various other greater or lesser anodic potentials. In so doing, those portions of resistor layer 206 which are exposed to etchant bath 210 are effectively etched by etchant bath 210. Those portions of resistor layer 206 which are not exposed to etchant bath 210 are not etched.

Figure 5:
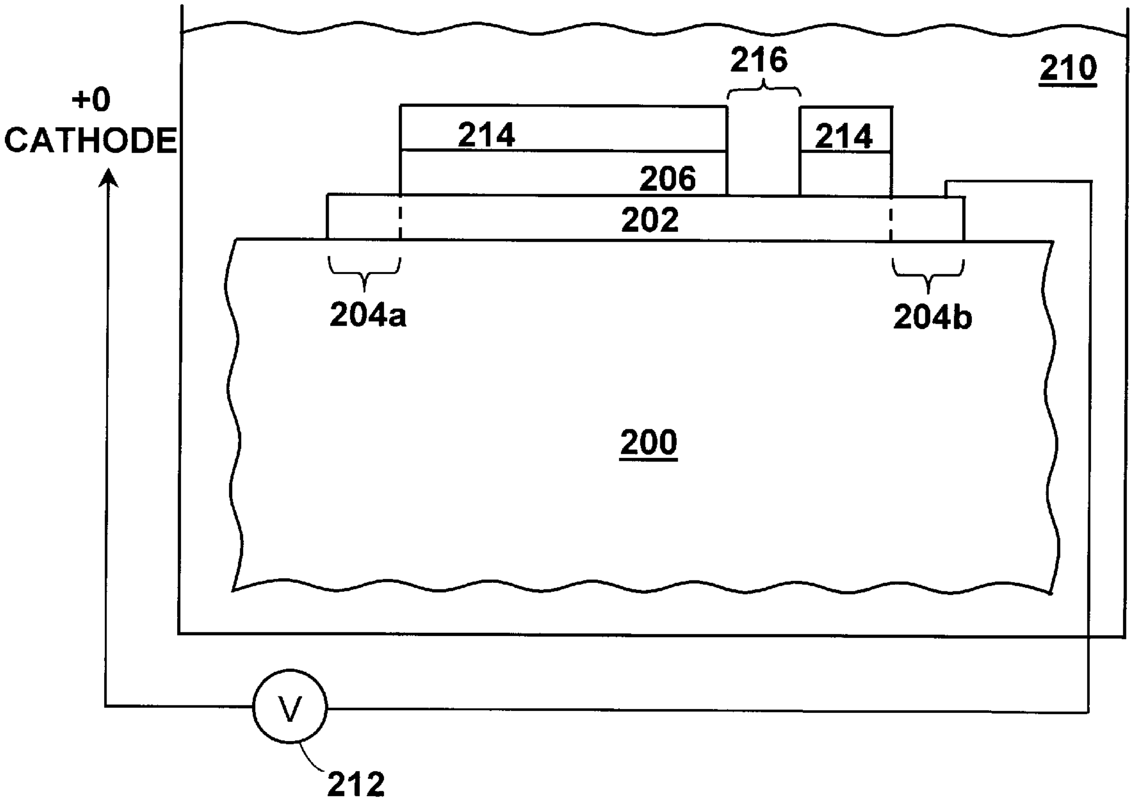
FIG. 5 is a side sectional view of the field emission display device of FIG. 4 having a portion etched therefrom in accordance with the present claimed invention.

Referring now to FIG. 5, by masking desired portions of resistor layer 206, resistor layer 206 is selectively wet etched. In the embodiment of FIG. 5, a mask layer 214 covers resistor layer 206 except for regions 216, and pad areas 204*a* and 204*b*. After immersing the field emission display device in etchant bath 210 and applying an anodic potential to the device, etching of resistor layer 206 has occurred only where the layers were exposed to the etchant bath (i.e. at pad areas 204*a* and 204*b*, and in region 216). Additionally, in the present embodiment, row electrode 202 is not damaged, even when exposed to etchant bath 210. Furthermore, unlike prior art etchants, the less caustic and non-hazardous etchant bath 210 of the present embodiment does not pose a threat to other layers which may be present in the field emission display device.

In another embodiment, the present invention is also well suited to protectively anodizing the areas of row electrode 202 (e.g. pad areas 204*a* and 204*b*). In such an embodiment, pad areas 204*a* and 204*b* are subjected to an anodizing potential (10–30 volts in one embodiment) and etchant bath 210 after any overlying material (e.g. residual intermetal dielectric material) has been removed from pad areas 204*a* and 204*b*. In the present embodiment, pad areas 204*a* and 204*b* are comprised of aluminum. In order to avoid the deleterious formation of, for example, $Al_2O_3$, pad areas 204*a* and 204*b* are protectively masked prior to the etching of resistor layer 206 in the present embodiment.

With reference still to FIG. 5, as mentioned above, the present invention is well suited to forming row electrode 202 and, consequently, pad areas 204*a* and 204*b* of various other materials. Such other materials includes, for example, an aluminum row electrode which is partially clad with tantalum, an aluminum electrode which is entirely covered with tantalum, and the like. In an embodiment in which pad areas 204*a* and 204*b* are comprised of a conductive material such as, for example, aluminum, having a top surface clad with another conductive material such as, for example, tantalum, the present embodiment subjects the tantalum-clad aluminum pad areas to an anodization process using, for example, a citric acid. In so doing, the exposed aluminum portions of pad areas (e.g. the side portions) are coated by a layer of $Al_2O_3$. After the anodization process, the tantalum-clad portions of the pad areas (e.g. the top surfaces) are coated with $Ta_2O_5$.

In an embodiment in which pad areas 204*a* and 204*b* are comprised of a conductive material such as, for example, aluminum, completely covered with another conductive material such as, for example, tantalum, the present embodiment subjects the tantalum-covered aluminum pad areas to an anodization process using, for example, a citric acid solution. In so doing, tantalum-covered pad areas are coated with $Ta_2O_5$. Although $Ta_2O_5$ is specifically mentioned in the present embodiment, the present invention is well suited to the use of various other stoichiometries. That is, the present invention is well suited to forming an anodized coating comprised of $Ta_xO_y$.

Hence, several substantial and novel advantages are associated with the present invention. Specifically, the present invention is well suited to removing resistor layer 206 from areas such as pad areas 204*a* and 204*b* of FIGS. 2–5. Furthermore, the present invention is well suited to removing resistor layer from, for example, pad areas 204*a* and 204*b* in a manner which prevents the formation of a substantially insulating anodic layer. That is, by keeping the anodic potential in the range of approximately 2–5 volts, the exposed portions of resistor layer 206 are effectively etched without forming a substantially insulating anodic layer on subsequently exposed portions of row electrode 202 of FIGS. 2–5.

Conversely, the present invention further provides the substantial benefit of readily producing a protective anodic layer when desired. That is, in instances where it is desired to protectively coat exposed portions of row electrode 202 of FIGS. 2–5, the anodic potential used during the etching process is increased to greater than approximately 2 volts. As a result, once overlying resistor layer 206 is etched away, the exposed regions of underlying row electrode 202 (e.g. tantalum pad areas and the like) will have a protective anodic coating formed thereon.

As yet another advantage, the present invention is well suited to initially rapidly removing overlying resistor layer 206 without deleteriously forming a substantially insulating anodic layer. Specifically, in such an embodiment, the initial anodic potential used during the etching process is greater than approximately 10 volts (e.g. 10–30 volts). In so doing, the resistor layer is efficiently and rapidly etched away. After the resistor layer has been substantially etched, the anodic potential is reduced to a potential (e.g. less than approximately 2–3 volts) which will not result in the formation of a substantially insulating anodic layer. Therefore, in such an embodiment, efficient and rapid etching is achieved without unwanted formation of a substantially insulating anodic layer.

Thus, the present invention provides an etching process which can remove selected portions or materials during the fabrication of a field emission display device wherein the etchant is not extremely hazardous. The present invention further provides an etching process which can remove selected portions or materials during the fabrication of a field emission display device wherein the etchant does not pose a threat of potential severe environmental damage. Additionally, the present invention provides an etching process which can remove selected portions or materials during the fabrication of a field emission display device without significantly compromising various other portions or layers of the field emission display device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications suited to the particular use contemplated. It is intended that the scope of the invention be defined by the claims appended hereto and their equivalents.

What is claimed is:

1. A method for selectively wet etching material during the formation of a field emission display device, said selective wet etching method comprising the steps of:

a) immersing, in a fluid bath, a structure of a field emission display device having a conductive electrode and a resistor layer disposed over said electrode, wherein said fluid bath includes an organic-acid etchant, said structure further including a pad area; and b) applying a potential to said conductive electrode such that exposed regions of said resistor layer are selectively wet etched.

2. The method for selectively wet etching material during the formation of a field emission display device as recited in claim 1 wherein step a) comprises:

immersing said resistor layer in deionized water including said organic-acid etchant.

3. The method for selectively wet etching material during the formation of a field emission display device as recited in claim 1 wherein step a) comprises:

immersing said resistor layer in said fluid bath wherein said fluid bath includes an oxo-acid.

4. The method for selectively wet etching material during the formation of a field emission display device as recited in claim 1 wherein step a) comprises:

immersing said resistor layer in said fluid bath wherein said fluid bath includes citric acid.

5. The method for selectively wet etching material during the formation of a field emission display device as recited in claim 1 wherein step a) comprises:

immersing said resistor layer in said fluid bath wherein said fluid bath includes approximately one percent by volume citric acid.

6. The method for selectively wet etching material during the formation of a field emission display device as recited in claim 1 wherein step b) further comprises:

b1) protectively anodizing said pad area by subjecting said pad area to said potential and said organic-acid etchant after any overlying material has been removed from said pad area.

7. A method for selectively wet etching material during the formation of a field emission display device using a non-hazardous etchant, said selective wet etching method comprising the steps of:

a) forming a non-hazardous etchant bath comprising deionized water and an oxo-acid;

b) immersing a structure of a field emission display device, having a conductive electrode and a resistor layer disposed over said electrode, in said non-hazardous etchant bath, said structure further including a pad area; and c) applying a potential to said electrode such that exposed regions of said resistor layer are selectively wet etched in said non-hazardous etchant bath.

8. The method for selectively wet etching material during the formation of a field emission display device using a non-hazardous etchant as recited in claim 7 wherein step a) comprises:

forming said non-hazardous etchant bath comprising deionized water and approximately one percent by volume citric acid.

9. The method for selectively wet etching material during the formation of a field emission display device using a non-hazardous etchant as recited in claim 7 wherein step c) further comprises:

c1) protectively anodizing said pad area by continuing to subject said pad area to said potential and said non-hazardous etchant bath after any overlying material has been removed from said pad area.

10. A method for selectively etching material during the formation of a field emission display device without requiring the use of hazardous etchants, said selective etching method comprising the steps of:

a) masking selected regions of a structure of a field emission display device having a conductive electrode and a resistor layer disposed over said electrode;

b) forming a non-hazardous etchant bath comprising deionized water and an oxo-acid;

c) immersing said structure in said non-hazardous etchant bath, said structure further including a pad area; and d) applying a potential to said electrode such that unmasked regions of said resistor layer are selectively wet etched in said non-hazardous etchant bath.

11. The method for selectively etching material during the formation of a field emission display device without requiring the use of hazardous etchants as recited in claim 10 wherein step b) comprises:

forming said non-hazardous etchant bath comprising deionized water and approximately one percent by volume citric acid.

12. The method for selectively wet etching material during the formation of a field emission display device using a non-hazardous etchant as recited in claim 10 wherein step d) further comprises:

d1) protectively anodizing said pad area by continuing to subject said pad area to said potential and said non-hazardous etchant bath after any overlying material has been removed from said pad area.

* * * * *